United States Patent
Ruotolo

(10) Patent No.: US 9,224,941 B2
(45) Date of Patent: Dec. 29, 2015

(54) SYSTEM WITH MAGNETICALLY STABLE STATES AND METHOD FOR ASSERTING MAGNETICALLY STABLE STATE

(75) Inventor: Antonio Ruotolo, Hong Kong (CN)

(73) Assignee: City University of Hong Kong, Kowloon (HK)

(*) Notice: Subject to any disclaimer, the term of this patent is extended or adjusted under 35 U.S.C. 154(b) by 212 days.

(21) Appl. No.: 13/809,585

(22) PCT Filed: Aug. 31, 2010

(86) PCT No.: PCT/CN2010/001323
§ 371 (c)(1),
(2), (4) Date: Jan. 10, 2013

(87) PCT Pub. No.: WO2012/027861
PCT Pub. Date: Mar. 8, 2012

(65) Prior Publication Data
US 2013/0121068 A1   May 16, 2013

(51) Int. Cl.
*G11C 11/16* (2006.01)
*G11C 11/14* (2006.01)
*G11C 11/02* (2006.01)
(Continued)

(52) U.S. Cl.
CPC .............. *H01L 43/08* (2013.01); *G11C 11/02* (2013.01); *G11C 11/14* (2013.01); *G11C 11/16* (2013.01); *G11C 11/18* (2013.01); *H01L 27/222* (2013.01); *H01L 27/228* (2013.01)

(58) Field of Classification Search
CPC ........ G11C 11/16; G11C 11/14; G11C 11/15; G11C 11/18; G11C 11/02; H01L 27/222; B82Y 10/00
See application file for complete search history.

(56) References Cited

U.S. PATENT DOCUMENTS 7,002,839 B2 * 2/2006 Kawabata et al. ............ 365/171
7,106,624 B2    9/2006 Huai et al.
(Continued)

FOREIGN PATENT DOCUMENTS

CN   101273406 A   9/2008
WO   2009051442 A2  4/2009

OTHER PUBLICATIONS

C. L. Chien, F. Q. Zhu and J-G Zhu, Physics Today 60, No. 6, 40.*
(Continued)

*Primary Examiner* — Hoai V Ho
*Assistant Examiner* — Roberto Mancera
(74) *Attorney, Agent, or Firm* — Amin, Turocy & Watson, LLP

(57) ABSTRACT

The disclosed subject matter relates to a non-volatile memory bit cell (500 or 600) for solid-state data storage, including, e.g., an elongated magnetic element (102) or "dot". For appropriate geometry and dimensions of the dot, a two-fold, energetically-degenerate micromagnetic configuration (100 or 200) can be stabilized. Such a stable configuration can consist of two magnetic vortices ($108_1$, $108_2$) and a flower state region (110). Due to energy minimization, the flower state region can be off-center (relative to a minor axis (106)) and along the major axis (104) of the dot. An electrical current (302) flowing perpendicular to the plane at, or in proximity to, the dot center can, according to current polarity, switch the configuration or state of the dot between the two specular magnetically stable configurations (e.g., a write operation). Reading of the cell state can be accomplished by using the magnetoresistive effect.

24 Claims, 12 Drawing Sheets

(51) Int. Cl.
 G11C 11/18 (2006.01)
 H01L 43/08 (2006.01)
 H01L 27/22 (2006.01)

(56) References Cited

U.S. PATENT DOCUMENTS

| | | | |
|---|---|---|---|
| 7,682,840 B2 * | 3/2010 | Hiebert et al. | 438/3 |
| 7,697,243 B1 | 4/2010 | Novosad et al. | |
| 7,898,849 B2 * | 3/2011 | Clinton et al. | 365/173 |
| 7,936,597 B2 * | 5/2011 | Clinton et al. | 365/173 |
| 7,952,915 B2 * | 5/2011 | Ono et al. | 365/158 |
| 8,094,487 B2 * | 1/2012 | Kim et al. | 365/158 |
| 8,766,733 B2 * | 7/2014 | Cyrille et al. | 331/94.1 |
| 8,854,871 B1 * | 10/2014 | Jain et al. | 365/158 |
| 2006/0023492 A1 | 2/2006 | Min et al. | |
| 2006/0087880 A1 * | 4/2006 | Mancoff et al. | 365/158 |
| 2008/0231392 A1 * | 9/2008 | Kim et al. | 333/147 |
| 2009/0117370 A1 * | 5/2009 | Deak | 428/332 |
| 2009/0161404 A1 * | 6/2009 | Prosandeev et al. | 365/145 |
| 2009/0244957 A1 * | 10/2009 | Clinton et al. | 365/158 |
| 2009/0296454 A1 * | 12/2009 | Honda et al. | 365/158 |
| 2011/0109397 A1 * | 5/2011 | Delaet et al. | 331/157 |
| 2011/0134561 A1 * | 6/2011 | Smith et al. | 360/59 |
| 2011/0141797 A1 * | 6/2011 | Slonczewski | 365/158 |
| 2014/0220707 A1 * | 8/2014 | Aggarwal et al. | 438/3 |

OTHER PUBLICATIONS

I.-G. Zhu, C. Park, Materials Today 9(11), 36.*
Christian J Amsinck et al Nanotechnology 16 2251.*
Matthias Kammerer, Markus Weigand, Michael Curcio, Matthias Noske, Markus Sproll, Arne Vansteenkiste, Bartel Van Waeyenberge, Hermann Stoll, Georg Woltersdorf, Christian H. Back, Gisela Schuetz Magnetic vortex core reversal by excitation of spin waves.*
International Search Report for PCT Patent Application No. CN2010/001323 dated Jun. 9, 2011, 13 pages.

* cited by examiner

SYSTEM WITH MAGNETICALLY STABLE STATES AND METHOD FOR ASSERTING MAGNETICALLY STABLE STATE

CROSS-REFERENCE TO RELATED APPLICATION

The subject application is a US national stage application of PCT Application Serial No. PCT/CN2010/001323, filed Aug. 31, 2010, and entitled "MAGNETIC MEMORY CELL," the disclosure of which is incorporated herein by reference in its entirety.

BACKGROUND OF THE INVENTION

Virtually every computer, appliance, or portable device makes use of mainly three different memory technologies to store and retrieve information: (1) a magnetic hard disk (HD), (2) dynamic random access memory (DRAM), and/or (3) FLASH memory technologies. The combined use of as many as three different technologies is generally due to the need to overcome various limitations exhibited by each individual technology.

For example, magnetic HDs provide the largest possible data density, yet magnetic HDs make use of sophisticated mechanics to enable such high data density. This sophisticated level of mechanics results in at least three unfortunate consequences. In particular, a magnetic HD is slow, energy consuming, and quite delicate, the last two limitations being largely unacceptable in portable devices. Semiconducting FLASH memories, widely used in pen drives and memory cards, are also non-volatile memory, yet do not suffer from the same fragility as do magnetic HDs. As a result, FLASH memory technologies, even though they cannot achieve a similar data density, are considered to be the best candidates to replace magnetic HD drives.

As a matter of fact, solid state HDs based on FLASH technology are already available in the marketplace today. However, after only a few years from their initial commercialization, such solid state HDs already appear to have reached a data density limit, despite the fact that the memory capacities remain about one order of magnitude smaller than that of a standard magnetic HD. In principle, this data density limit of FLASH memory technologies is the same as that limiting the performance of the very fast DRAMs. In particular, in both cases, information is retained by storing charge and the charge always leaks, either through the tunnel barrier, when it is made as thin as possible to increase velocity, like in DRAMs, or through the barrier sidewalls, when the bit cells are made as small as possible to increase density, like in current solid state HDs.

This consideration appears to suggest that memories of the future might still make use of magnetic materials, given such materials do not suffer from charge dissipation/leaks. For example, by using such materials, one does not have to rely on the charge of the electrons. Rather, one can rely on the magnetic moment. Such is another aspect of the revolutionary concept behind spintronics, first introduced by Albert Fert (Baibich et al., Physical Review Letters, volume 61, pages 2472-2475) and Peter Grunberg (Binach et al. Physical Review B, volume 39, pages 4828-4830), which garnered a Nobel Prize award in 2007.

In view of these and other recent breakthroughs, a number of devices have been proposed which make use of magnetic bit cells and yet do not have fragile mechanical parts. Such magnetic bit cells are usually referred to as magnetic random access memories (MRAMs), since they combine the non-volatility of the magnetic memories with the functionalities of the random access memories. In these devices, while reading is easily accomplished by using any of the magnetoresistive or Hall effects, information is written by either reversing the entire orientation of the magnetization of patterned magnetic structures (see, for instance, Schuster-Woldan et al., US 2001/0035545 (A1)) or by displacing domain walls between stable positions, usually represented by geometrical constrictions (see, for instance, Bland et al. U.S. Pat. No. 7,102,477 (B2) and Wunderlich U.S. Pat. No. 6,727,537 (B2)). Another possibility recently proposed is to switch either the core or the chirality of a magnetic vortex in a magnetic dot (see, for instance, Min et al. US 2006/0023492 (A1)).

However, in all these cases, density is limited by electromagnetic cross-talk effects, when the writing process relies on the local magnetic field produced by the current flowing on the address lines (Nozaki et al. Journal of Applied Physics, volume 93, pages 7295-7297). As an alternative, writing can rely on spin transfer torque effect (Slonczewski, Journal of Magnetism and Magnetic Materials, volume 159, pages L1-L7, Huai et al. U.S. Pat. No. 7,106,624 (B2)) but, so far, this requires large current densities, with a consequent limitation of the bit density due to Joule heating.

Accordingly, a challenge remains in the field of magnetic bit cells to find scalable magnetic structures that can be switched between two stable magnetic configurations while using small write currents.

SUMMARY OF THE INVENTION

The following presents a simplified summary of the disclosed subject matter in order to provide a basic understanding of some aspects of the disclosed subject matter. This summary is not an extensive overview of the disclosed subject matter. It is intended to neither identify key or critical elements of the disclosed subject matter nor delineate the scope of the disclosed subject matter. Its sole purpose is to present some concepts of the disclosed subject matter in a simplified form as a prelude to the more detailed description that is presented later.

The subject matter disclosed herein, in one or more aspects thereof, comprises an architecture including a magnetic element or "dot" with at least two magnetically stable states. The magnetic element can be ferromagnetic and electrically conductive, with an elongated geometry (e.g., an ellipse) that allows two-fold energetically-degenerate magnetic configurations.

In accordance therewith and to other related ends, the magnetic element can include two magnetic vortices and a flower state region situated off-center of a minor axis of the magnetic element, wherein the two magnetic vortices and the flower state region are arranged on the magnetic element in one of the two magnetically stable configurations. Appreciably, because the magnetic element can be arranged in one of two stable configurations (e.g., flower vortex states), one flower vortex state can be defined as state "0" while the other can represent state "1". Hence, the magnetic element can serve as a core of a bit memory cell.

It should be appreciated that the initial magnetization state of a magnetic element useful as a bit-cell such as that described herein, is not necessarily one of the two flower vortex configurations, such as when the magnetic element is patterned out of a grown film. In any case, the architecture can further employ a method of magnetically stabilizing the magnetic element, which can bring the magnetic element into a flower vortex configuration in one of two ways, depending upon whether the flower vortex state is an absolute energy minimum or a relative energy minimum. For example, by applying a field out of the plane of magnitude not smaller than the film saturation magnetization the magnetic element can be brought into a relative energy minimum flower vortex state. Alternatively, and only in the case where the flower vortex state is the absolute energy minimum, the initialization can be obtained by warming the system above its Curie temperature. If more than one magnetic element is collectively organized in an array to form a memory device, all magnetic elements will be all simultaneously set in either of the flower vortex states. Such initialization procedures typically need only be done once and can remain in a flower vortex state forever thereafter assuming the array of bit-cells are properly shielded from magnetic field during normal operations as described herein.

In addition, the magnetic element can also be equipped with a reading means for sensing a current state of the magnetic element, which can function as a read operation to determine whether the magnetic element is in state "0" or in state "1". Furthermore, the magnetic element can be equipped with a writing means for asserting a magnetically stable state consistent with either one of the degenerate magnetic configurations, which can function as a write operation to assert a state of either "0" or "1".

The following description and the annexed drawings set forth in detail certain illustrative aspects of one or more non-limiting embodiments. These aspects are indicative, however, of but a few of the various ways in which the principles of the claimed subject matter may be employed and the claimed subject matter is intended to include all such aspects and their equivalents. Other advantages and distinguishing features of the claimed subject matter will become apparent from the following detailed description of the various embodiments when considered in conjunction with the drawings.

DETAILED DESCRIPTION OF THE PREFERRED EMBODIMENTS

Figure 1:
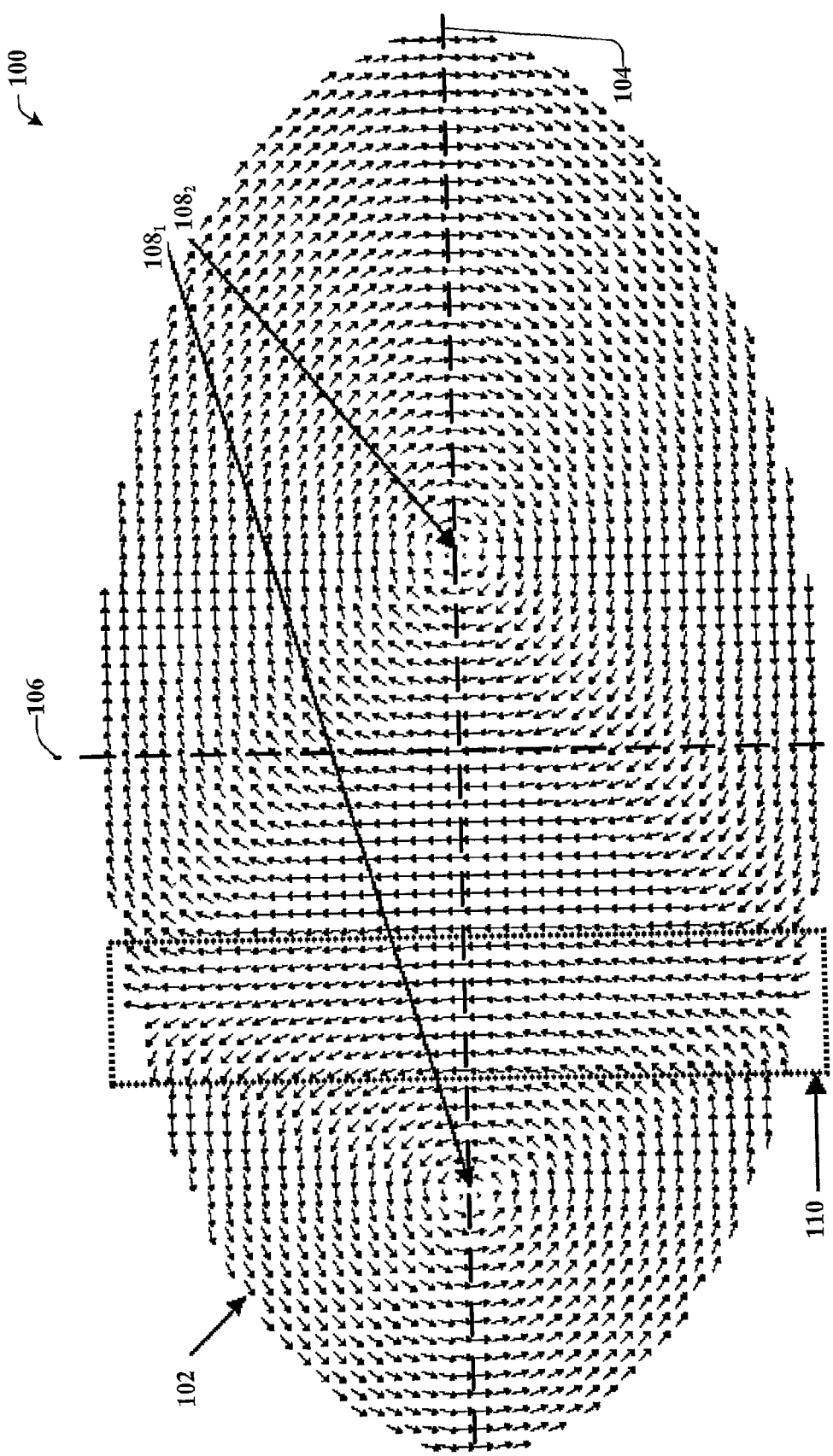
FIG. 1 illustrates a block diagram of a system with at least two magnetically stable states arranged in a first magnetically stable state.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the claimed subject matter may be practiced without these specific details. In other instances, well-known structures and devices are shown in block diagram form in order to facilitate describing the various embodiments.

What is disclosed herein generally relates to a magnetic, conductive bit cell or components thereof that can be switched between two stable, specular magnetic configurations by the application of a small current perpendicular to the bit cell plane. The cell can consist of an elongated magnetic element or "dot," the geometry of which is chosen so as a non-uniform magnetic configuration, consisting of two vortices and a flower state region, can be stabilized. A possible realization of such geometry can be an ellipse of predetermined thickness and aspect ratio. Such a configuration represents a two-fold, degenerate, relative energy minimum of the system.

Appreciably, a given stable state is not necessarily the absolute energy minimum, but it can be easily stabilized by the application of an out-of-plane field, typically not smaller than the film saturation magnetization. Because of the curling magnetic configuration, magnetostatic interaction between bit-cells is very small, allowing high density integration. Moreover, the cell can be switched between the two states by applying a current perpendicular to the cell plane. This current can be forced to flow in a region that is smaller than the dot area, which can be, but need not necessarily be concentric with the dot area.

Accordingly, based upon the current, a magnetic potential can be generated that is attractive for one vortex and repulsive for the other, depending upon the current polarity. The minimum write current can be achieved by making the current region concentric with the dot. Yet, this implies the use of a second magnetoresistive contact for data reading. However, by displacing the current region with respect to the dot center, the same contact can be used for both data reads and writes.

As used in this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." Therefore, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Referring now to the drawings, with reference initially to FIG. 1, system 100 with at least two magnetically stable states is depicted. Generally, system 100 can be composed of an elongated, electrically conductive magnetic element 102 with a geometry that allows two-fold, energetically-degenerate magnetic configurations. A first example energetically-degenerate magnetic configuration is illustrated here, while a second example energetically-degenerate magnetic configuration can be found with reference to FIG. 2, the combination of which are intended to represent examples of both magnetically stable states of the two-fold, energetically-degenerate magnetic configurations.

In addition, system 100 also depicts with broken lines both major axis 104 and minor axis 106 associated with magnetic element 102, which are utilized herein for descriptive and/or reference purposes, including that for other figures. Moreover, while magnetic element 102 is typically envisioned to be an electrically-conductive ferromagnetic material, some illustrations (e.g., FIGS. 1, 2, and 7) depict magnetic element 102 in terms of a plurality of arrows representing an in-plane magnetization, which is believed to be more effective at conveying certain concepts and features of the disclosed subject matter.

Figure 2:
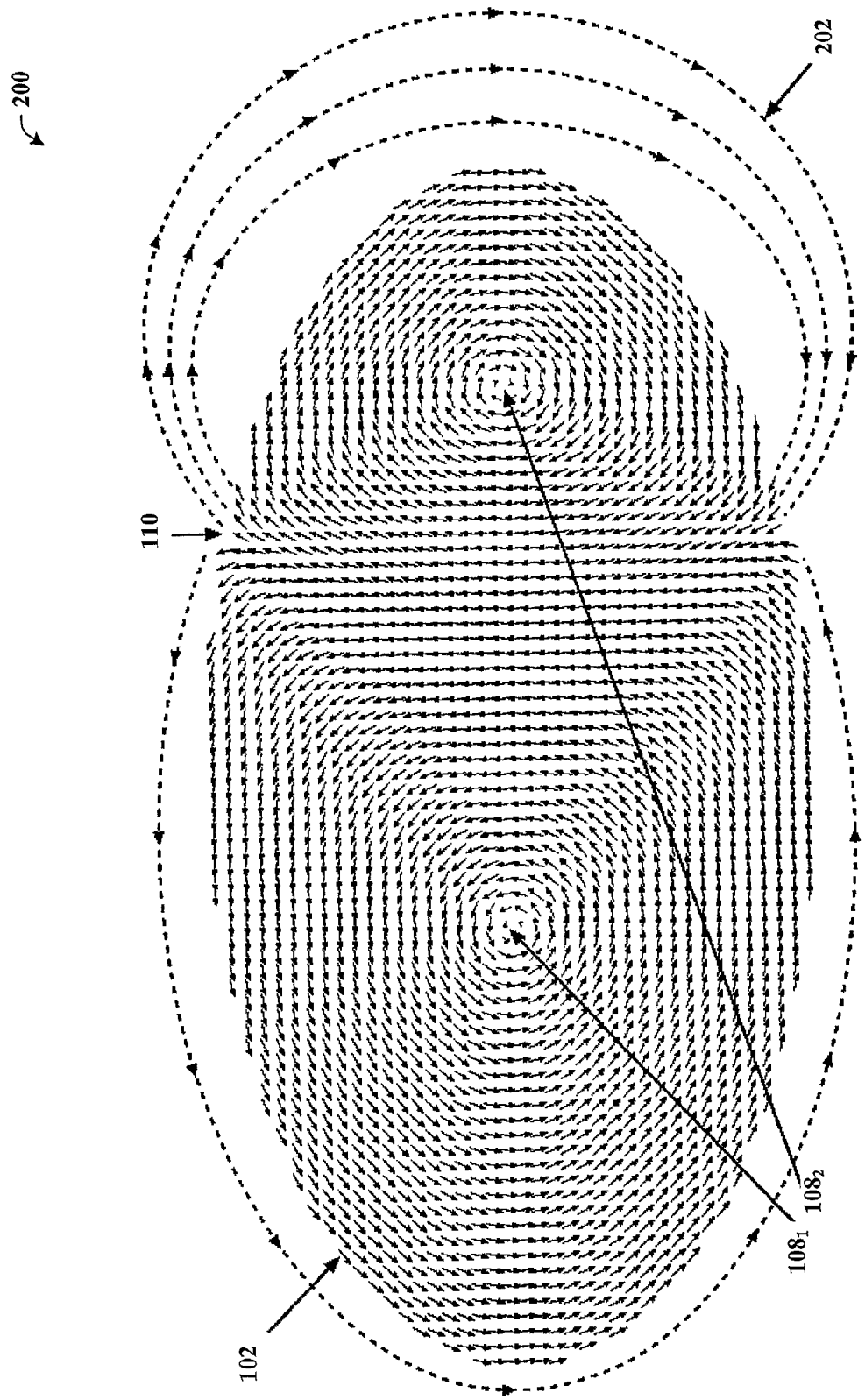
FIG. 2 depicts a block diagram of a system with at least two magnetically stable states arranged in a second magnetically stable state.

In one or more aspect, magnetic element 102 can include first magnetic vortex $108_1$ and second magnetic vortex $108_2$, which can be collectively referred to as magnetic vortices 108. Additionally, magnetic element 102 can include flower state region 110, which can be situated off-center of minor axis 106. For example, in FIG. 1, flower state region 110 is situated to the left of minor axis 106, whereas in FIG. 2 flower state region 110 is situated to the right of minor axis 106. However, in both cases, magnetic vortices 108 and flower state region 110 are arranged in a magnetically stable configuration. FIG. 1 illustrates a first magnetically stable configuration, whereas FIG. 2 represents a corresponding second magnetically stable configuration of the two-fold, energetically-degenerate magnetic configurations. Appreciably, the relative locations of magnetic vortices 108 and flower state region 110 can be dependent upon the shape and/or geometry of magnetic element 102, which, in one or more aspects can be configured as an ellipse.

Typically, and as depicted in FIG. 1, both magnetic vortices 108 will be centered on major axis 104 and will further be situated on opposing sides of minor axis 106, however, such need not necessarily be the case. Regardless, for a particular aspect ratio and thickness of magnetic element 102, a stable magnetic configuration exists where the magnetization curls to form two vortices exemplified by first magnetic vortex $108_1$ and second magnetic vortex $108_2$. Moreover, due to exchange energy minimization, the two magnetic vortices 108 will generally be characterized by opposite chirality, wherein chirality relates to a curling direction (e.g., clockwise or counterclockwise) of in-plane magnetization of a given magnet vortex. Thus, a chirality of first magnetic vortex $108_1$ curls in an opposite direction as a chirality of second magnetic vortex $108_2$.

Because the two magnetic vortices 108 have opposite chirality, a magnetization distribution referred to herein as a "flower state" can be observed (e.g., in flower state region 110). For example, a flower state can be characterized by an average magnetization pointing perpendicular to major axis 104 and/or parallel to minor axis 106, which can effect or characterize a magnetically stable state or configuration.

In one or more aspects, magnetic element 102 can be configured (further detailed infra) to enable displacement of first magnetic vortex $108_1$, second magnetic vortex $108_2$, and flower state region 110 along major axis 104 to arrive at a second magnetically stable configuration (e.g., FIG. 2) that is energetically equivalent to the first magnetic configuration (e.g., FIG. 1). For example, with particular reference to FIG. 2, closure of stray field 202 with minimum energy cost implies displacement of flower state region 110 along the major axis (not shown, refer to element 110 of FIG. 1). Appreciably, such displacement can be accompanied by displacement of the two vortices 108 along the same axis. Regardless, the final stable magnetic configuration will be one of the two, energetically equivalent configurations shown in FIGS. 1 and 2, respectively. By convention, FIG. 1 is denoted the first magnetically stable configuration and FIG. 2 is denoted the second magnetically stable configuration, either of which can be referred to herein as a "flower vortex" configuration or a "flower vortex" state.

It should be appreciated that since magnetic element 102 can be configured to enable two states, and further that both states are magnetically stable, magnetic element 102 can serve as a core of a single-bit memory cell. For example, one of the two flower vortex states can represent a logical "0", whereas the other flower vortex state can represent a logical "1". To enable such functionality, magnetic element 102 can be extended to provide for switching between and/or asserting a particular flower state (e.g., the functional equivalent to a write operation); and to provide for sensing a current flower state in a non-destructive or non-altering manner (e.g., the function equivalent to a read operation). These and other features are further described with reference to FIGS. 3A-7.

Figure 3A:
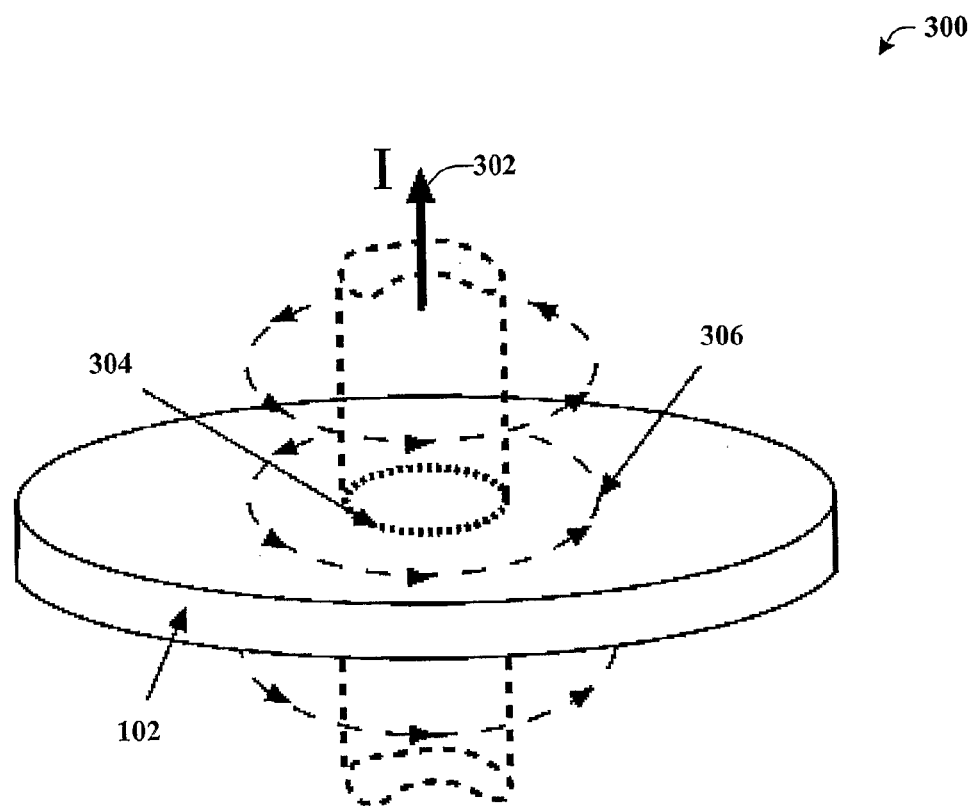
FIG. 3A illustrates a diagram that depicts a schematic illustration of physical principles that can be employed to switch the magnetic element between two flower vortex states exemplified by FIGS. 1 and 2, respectively.

Turning now to FIG. 3A, diagram 300 depicts a schematic illustration of physical principles that can be employed to switch the magnetic element between two flower vortex states exemplified by FIGS. 1 and 2, respectively. In particular, a current state associated with magnetic element 102 can be switched between the two flower vortex states by applying a bipolar direct current pulse (e.g., write current 302) as described below. For example, current 302 can flow perpendicular to the plane of magnetic element 102, and in a region 304 smaller than the size of magnetic element 102. As depicted, region 304 can be circular and can be concentric with magnetic element 102, however, it should be understood that such need not be the case. Rather, in certain aspects, region 304 need not be concentric with magnetic element 102 and/or need not have a circular cross-section shape.

Figure 3B:
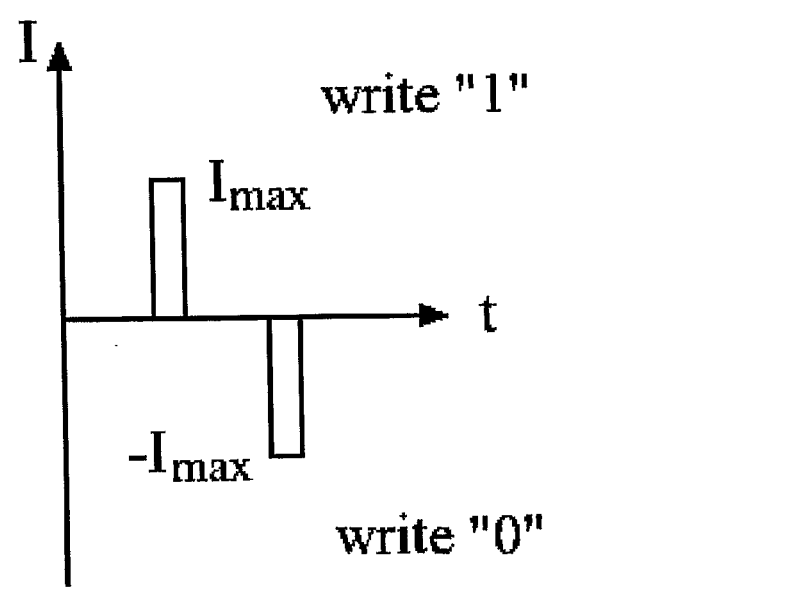
FIG. 3B provides graphic illustration 310 of electric current pulses that can be applied to the magnetic element for a write operation.
Figure 4:
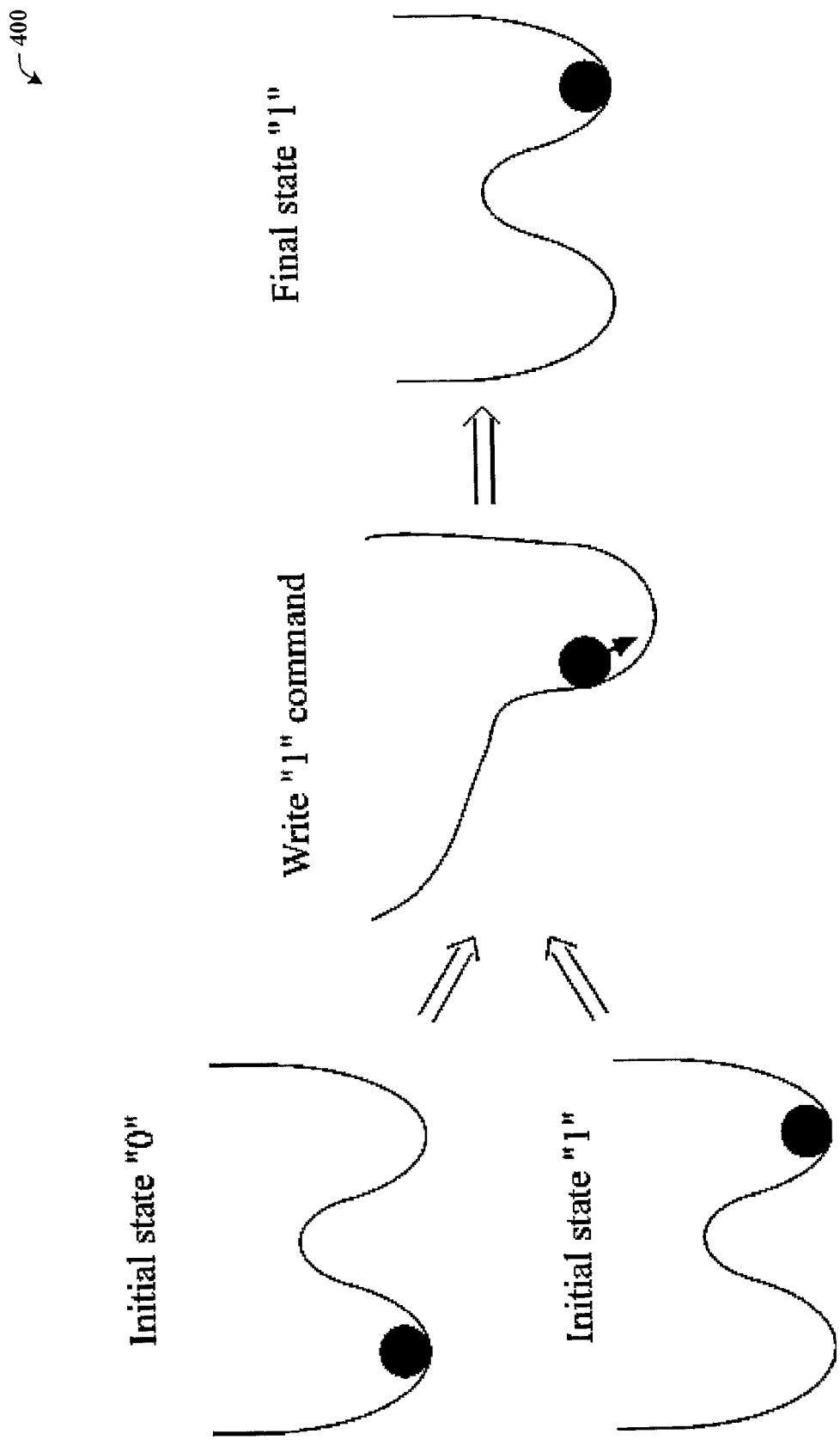
FIG. 4 depicts a diagram of a graphic illustration of the evolution of the magnetic element configurations when a write current is applied.

However, minimization of write current 302 can be obtained by ensuring region 304 is concentric with magnetic element 102. Regardless, write current 302 can generate a circular Oersted field 306, wherein field lines of Oersted field 306 can be parallel to the plane of magnetic element 102, as depicted. Appreciably, the polarity of write current 302 can determine the direction of the circular Oersted field 306. For example, the polarity of write current 302 can produce Oersted field 306 that is either clockwise or counterclockwise in direction and which is referred to herein as "Oersted field chirality". Moreover, FIG. 3B provides graphic illustration 310 of electric current (e.g., write current 302) pulses that can be applied to magnetic element 102 for a write operation. For example, a positive current pulse, characterized by $I_{max}$, can assert a "1" by producing an associated Oersted field 306, whereas a negative current pulse, characterized by $-I_{max}$, can assert a "0" by producing an Oersted field 306 of opposite chirality.

Accordingly, if it is assumed that magnetic element 102 is in the flower vortex state of FIG. 1, then flower state region 110 is displaced to the left of minor axis 106, which can be denoted by convention as state "0". In that case, write current 302 flowing in the direction out of the page in FIG. 1 (e.g., a positive current pulse) can generate an Oersted field 306 having the same chirality as that of left magnetic vortex $108_1$ and opposite chirality as that of right magnetic vortex $108_2$. Such a condition implies that the magnetic potential generated by write current 302 is attractive for left magnetic vortex $108_1$ and repulsive for right magnetic vortex $108_2$. Thus, if the Zeeman energy (characterized by the energy of the interaction between the magnetization and an applied magnetic field) provided to the magnetic system by write current 302 is large enough to overcome the energy barrier between the two flower vortex states, magnetic element 102 will switch to the second magnetically stable configuration. Thus, when write current 302 is removed, the final state will be that exemplified by FIG. 2 (with flower state region 110 displaced to the right, e.g., state "1").

On the other hand, if the initial state of magnetic element 102 is that exemplified by FIG. 2 (with flower state region 110 displaced to the right), the system will temporarily move from flower state equilibrium to account for the additional Zeeman energy. However, such an over-energized state will recede and will therefore return to the initial state once write current 302 is removed. The above-mentioned features are detailed with reference to FIG. 4, which provides graphic illustration 400 of the evolution of the magnetic element configurations when write current 302 is applied. For instance, write current 302 configured as a positive current pulse produces a final state of "1" (e.g., the flower vortex state of FIG. 2) irrespective of whether the initial flower vortex state of magnetic element 102 was initially a "0" or a "1".

Similarly, although not expressly depicted, it can be readily appreciated that write current 302 configured as a negative current pulse is ineffective at switching configurations if the system is already in the state "0", whereas the flower vortex state of magnetic element 102 will switch if the system is in the state "1". In either case, it should be appreciated that the magnitude of write current 302 should be high enough to overcome the energy barrier between the two flower vortex states, yet not so high as to drive magnetic element 102 into a single vortex state. An example practical implementation of a single-bit memory cell that can enable switching between the two flower vortex states and/or asserting a particular flower vortex state (e.g., a write operation) can be found with reference to FIG. 5.

Figure 5:
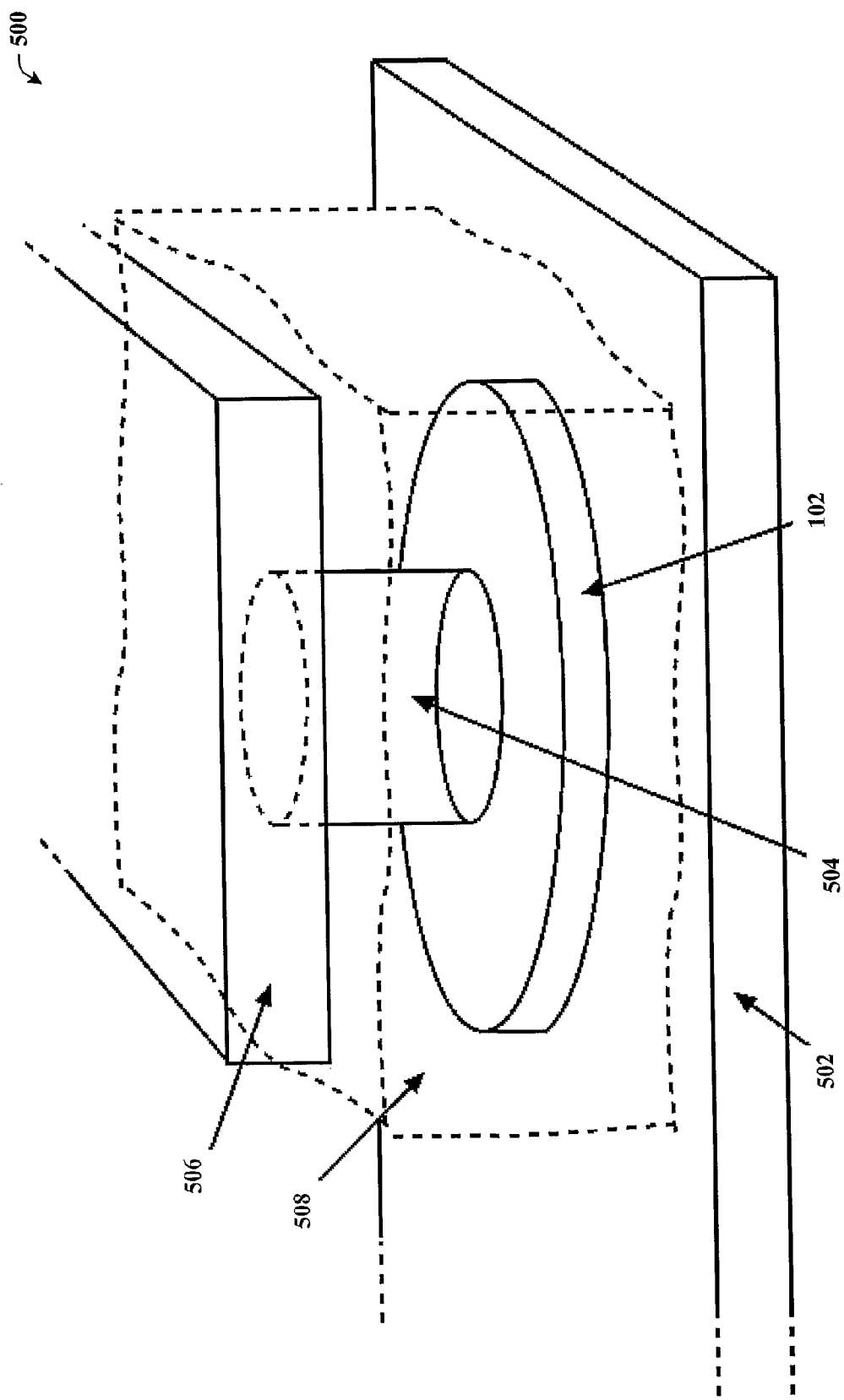
FIG. 5 provides diagram of a graphic depiction illustrating an example embodiment of a write-enabled memory cell.

Referring now to FIG. 5, system 500 that represents an example embodiment of a write-enabled memory cell is illustrated. In general, system 500 can include magnetic element 102, which can be situated on top of an electrode, in this case bottom electrode 502. In addition, system 500 can also include a second element, denoted here as contact 504, which be composed of a current-carrying, non-magnetic material. Contact 504 can be situated on top of magnetic element 102 and can be configured to occupy a smaller area than that of magnetic element 102. Furthermore, system 500 can include top electrode 506, which can be situated on top of contact 504. Top electrode 506 can be isolated from magnetic element 102 and from bottom electrode 502 by insulator 508, which can be composed of a magnetically- and/or electrically-insulating material. It should be appreciated that beyond a particular thickness of contact 504, the effect of Oersted field 306 generated by write current 302 on the electrodes 502, 506 is negligible.

In accordance with the above, it is readily apparent that magnetic element 102 of FIGS. 1 and 2 can be leveraged to provide a bit memory cell capable of switching between the two stable flower vortex states, which can be characterized as a write operation for the bit memory cell. In particular, magnetic element 102 can further include a write operation component that can be configured to assert one of the at least two magnetically stable states referred to in connection with FIGS. 1 and 2. The write operation component can be exemplified by system 500 and is therefore referred to herein as write operation component 500.

In particular, write operation component 500 can include a non-magnetic, electrically-conductive contact (e.g., contact 504) configured to generate a magnetic potential that is attractive to a chirality of one of the two magnetic vortices 108, while contemporaneously repulsive to the other of the two magnetic vortices 108. Moreover, write operation component 500 can further include a bottom electrode (e.g., bottom electrode 502) coupled to magnetic element 102 and a top electrode (e.g., top electrode 506) coupled to the non-magnetic, electrically-conductive contact (e.g., contact 504).

In one or more aspects, write operation component 500 can be configured to generate the aforementioned magnetic potential based upon application of an electric current (e.g., write current 302) flowing perpendicular to both major axis 104 and minor axis 106 of magnetic element 102, wherein the electric current flows through a region smaller than a size of magnetic element (e.g., a region consistent with the smaller-sized contact 504). It should be appreciated that while the above has been described with respect to writing operations, reading (e.g., detecting a current configuration of magnetic element 102 in a non-destructive fashion) can be accomplished by sensing the magnetic configuration by way of any suitable known or later discovered magnetoresistive effect, potentially in any region of magnetic element 102.

For example, magnetic element 102 can further include a read operation component comprising a magnetoresistive contact configured to sense a magnetic configuration of magnetic element 102. In addition, the read operation component can further include a bottom electrode coupled to magnetic element 102 and a top electrode coupled to the magnetoresistive contact. Appreciably, the read operation component can be substantially similar to write operation component 500 in terms of top and bottom electrodes (e.g., 502 and 506), yet differ in that contact 504 can be substituted with the magnetoresistive contact. Regardless, in one or more aspects, the read operation component can be configured to distinguish between the first magnetically stable configuration (e.g., FIG. 1) and a second magnetically stable configuration (e.g., FIG. 2) based upon, e.g., a detected voltage between the bottom electrode and the top electrode. Additional detail with respect to both read and write operations can be found in connection with FIG. 6, which illustrates utilization of a single example contact for both write operations and read operations.

Figure 6:
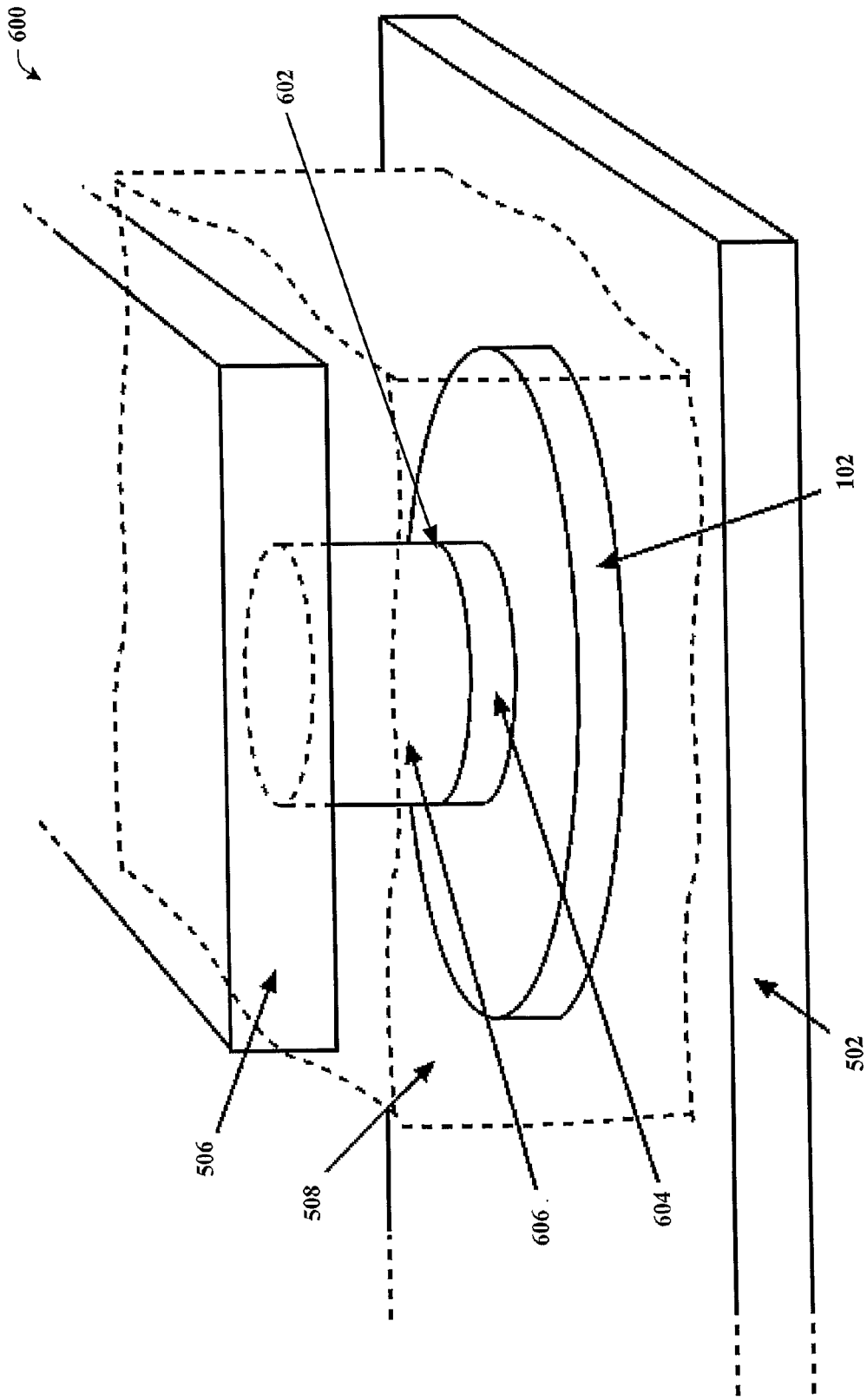
FIG. 6 depicts a diagram of a graphical depiction of a system representing an example embodiment of a memory cell with an integrated magnetoresistive contact for both write and read operations.

Turning now to FIG. 6, example graphical depiction of system 600 representing an example embodiment of a memory cell with an integrated magnetoresistive contact for both write and read operations is provided. System 600 can be substantially similar to system 500, wherein both systems include bottom electrode 502 and top electrode 506 as well as insulator 508 constructed around magnetic element 102. However, one distinction between systems 500 and 600 can be that the current-carrying, non-magnetic contact 504 of system 500 can be substituted with magnetoresistive stack 602 of similar dimensions and location for system 600.

Magnetoresistive stack 602 can be composed of non-magnetic spacer layer 604 and a polarizer layer 606. Polarizer layer 606 can be either a single-layer or multi-layer polarizer with fixed magnetization in a typical spin-valve configuration. Thus, non-destructive reading of a current state of magnetic element 102 can be accomplished by injecting a read current (typically of smaller magnitude than write current 302) and detecting the corresponding voltage between electrodes 502 and 506. Appreciably, if the contact (in this case magnetoresistive stack 602 and/or constituent parts 604 and 606) is concentric with magnetic element 102, as depicted, then the change of average magnetic moment and, consequently, of voltage between the two stable flower vortex states is zero. However, changes in read voltages between the two flower vortex states increases rapidly if the contact is displaced along minor axis 106 of magnetic element 102, which is further detailed in connection with FIG. 7.

Figure 7:
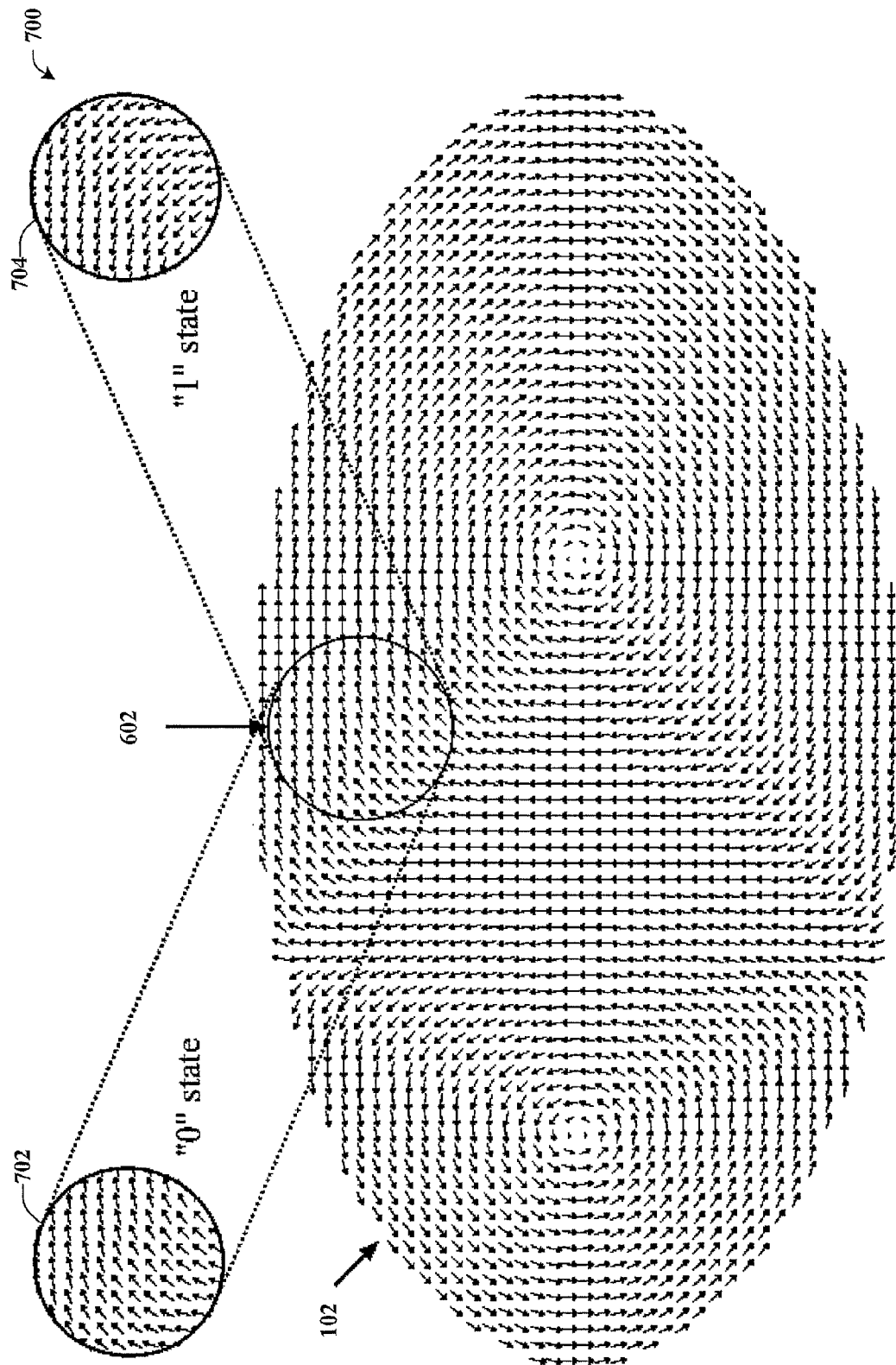
FIG. 7 illustrates a diagram of a graphical depiction providing a view of the magnetic element illustrating the change of magnetic configurations detected with the magnetoresistive stack as the magnetoresistive stack is displaced along the minor axis of the magnetic element.

While still referring to FIG. 6, but turning now as well to FIG. 7, graphical depiction 700 provides a view of magnetic element 102 illustrating the change of magnetic configurations detected with the magnetoresistive stack 602 as magnetoresistive stack 602 is displaced along minor axis 106 is provided. Thus, as described above, if magnetoresistive stack 602 is situated concentric with magnetic element 102, the associated voltage reading might not provide an effective means to distinguish between the two flower states. However, by displacing magnetoresistive stack 602 along minor axis 106 (in this case in the upward or northward direction), voltage differences between the two flower vortex states can be observed.

For example, when magnetic element 102 is configured in the first flower vortex state (e.g., FIG. 1), then the magnetization pattern at the location of magnetoresistive stack 602 can resemble that depicted by call-out region 702, which has been defined by convention as the "0" state. On the other hand, when magnetic element 102 is configured in the second flower vortex state (e.g., FIG. 2), then the magnetization pattern at the location of magnetoresistive stack 602 can resemble that depicted by call-out region 704, conversely defined by convention as the "1" state. In either case, injecting the read current through magnetoresistive stack 602 will yield associated voltage readings that are distinguishable with respect to the two flower vortex states.

Thus, offsetting the magnetoresistive stack 602 along minor axis 106 can provide a more effective means for read operations. However, as noted previously, minimization of write current 302 can be obtained by ensuring region 304 is concentric with magnetic element 102. Accordingly, since magnetoresistive stack 602 can facilitate both read and write operations, it should be noted that by offsetting magnetoresistive stack 602 along minor axis 106, a slight increase in write current 302 when performing a write operation might be necessary (e.g., relative to the write current required when magnetoresistive stack 602 is situated concentric with magnetic element 102). Moreover, in the configuration depicted by FIG. 7 (e.g., with magnetoresistive stack 602 offset along minor axis 106), spin transfer torque can be at play during a given write operation. Yet, this effect is negligible in the range of currents required to drive write operation that can be envisioned for high-density memory devices.

In accordance with the above, it should be appreciated that magnetic element 102 can therefore be extended with all or portions of a read/write component to construct a single-bit memory cell capable of reading (e.g., non-destructive detection of a current state of magnetic element 102) and writing (e.g., asserting a particular state for magnetic element 102). In particular, the read/write component can include a non-magnetic spacer (e.g., non-magnetic spacer layer 604) coupled to magnetic element 102 and a single- or multi-layer polarizer (e.g., polarizer layer 606) with fixed magnetization coupled to the non-magnetic spacer. In addition the read/write component can further include a bottom electrode (e.g., bottom electrode 502) coupled to magnetic element 102 and a top electrode (e.g., top electrode 506) coupled to the polarizer.

In one or more aspects, the read/write component can be configured to generate a magnetic potential based upon application of write current 302 across the read/write component, wherein write current 302 flows perpendicular to both major and minor axes 104 and 106, respectively, of magnetic element 102 (e.g., either into or out of the plane of magnetic element 102). Moreover, write current 302 be applied through a region smaller than a size of magnetic element 302 in order to assert one of the at least two magnetically stable states. Furthermore, write current 302 can flow through a region of magnetic element 102 that is offset along minor axis 106, which can be established based upon a location of magnetoresistive stack 602. With respect to read operations, the read/write component can be configured to distinguish between the at least two magnetically stable states based upon a detected voltage across the read/write component upon injection of a read current between the top and bottom electrodes, wherein the read current is typically smaller than write current 302 in order to avoid asserting a particular state in magnetic element 102.

Moreover, in one or more aspects magnetic element 102, which along with associated magnetoresistive stack 602 and (optionally) bottom electrode 502 and top electrode 506 can constitute a single-bit memory element, can be arranged with a plurality of additional magnetic elements and associated components, organized as an array of single-bit memory cells. Such an array of memory cells can provide high-density, solid-state memory based upon the ferromagnetic cells and associated principles described herein rather than based upon storage of electrical charge as is customary in conventional memory. Thus, the disclosed memory can effectively combine the high data density typical of magnetic hard discs, yet with the high velocity typical of dynamic random access memory and the non-volatility typical of flash memory. Two example memory arrays are provided in connection with FIGS. 8 and 9. In particular, FIG. 8 relates to a 1T1C (one transistor-one cell) architecture, whereas FIG. 9 relates to a transistor-less architecture.

Figure 8:
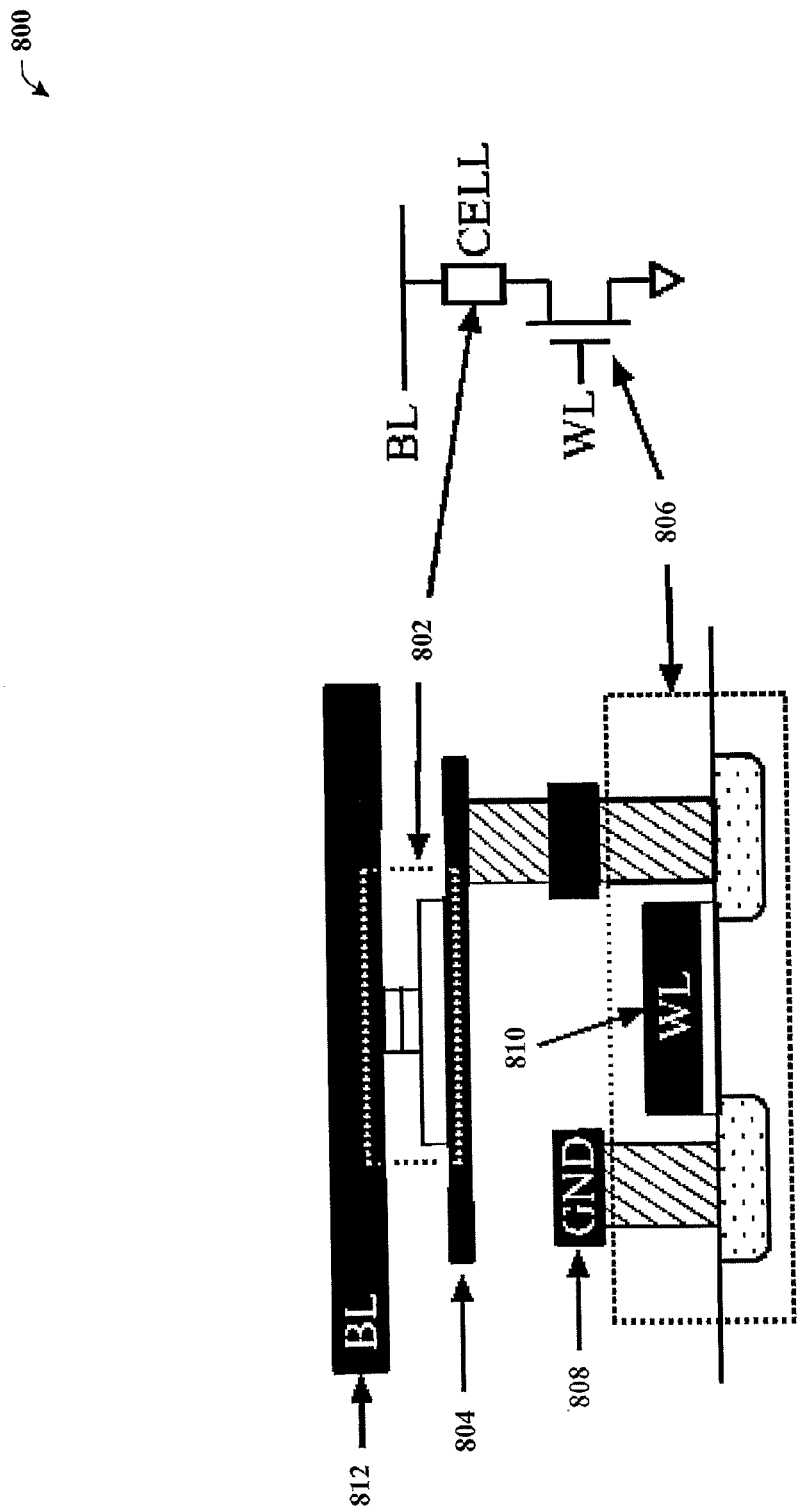
FIG. 8 depicts a block diagram of a system that depicts an embodiment of the integration of the single-bit memory cell into a one transistor-one cell chip architecture.

Turning now to FIG. 8, system 800 depicts an embodiment of the integration of the single-bit memory cell into a one transistor-one cell chip architecture. The single-bit memory cell(s) can be characterized by magnetic element 102 and magnetoresistive stack 602, as substantially described supra, and hereinafter denoted bit-cell(s) 802. Bit cell 802 can be situated on top of a patterned bottom electrode 804 that can run row-wise throughout the array and can function as substantially described in connection with bottom electrode 502. In turn the patterned bottom electrode 804 can be situated on top of transistor 806 (e.g., one for each bit-cell 802), wherein the patterned bottom electrode 804 can be connected to ground 808 through an output port of transistor 806. Moreover, word-line 810 can enable a row of transistors 806, connecting all bit-cells 802 on that row to the ground 808. Furthermore, a bit-line 812 can connect a column of bit-cells 802 and can serve as a common top electrode (e.g., such as that described in connection with top electrode 506) for all bit-cells 802 in that column. However, only the enabled bit-cell 802 on the selected bit-line 812 will be addressed based upon the selected row.

Figure 9:
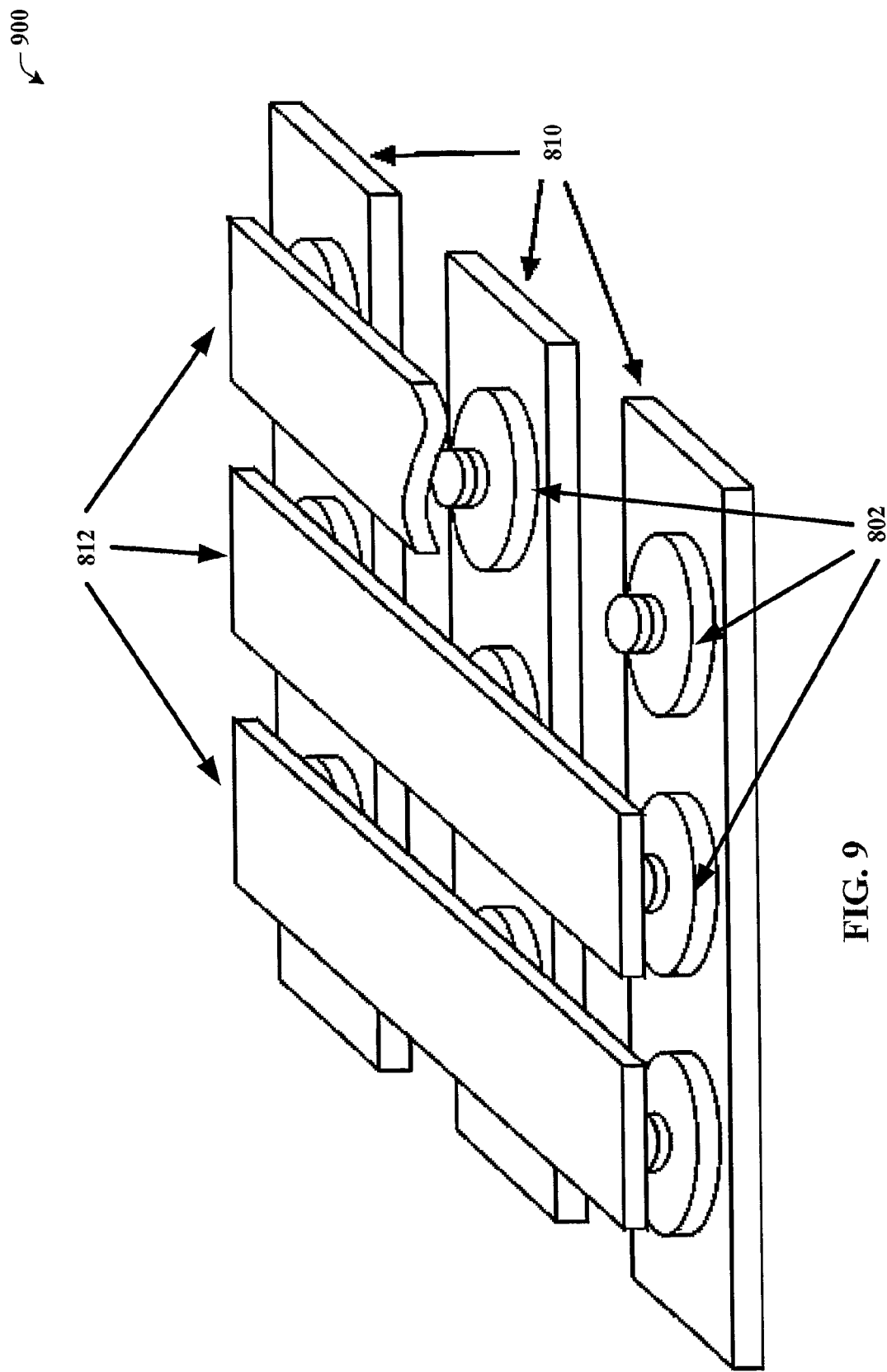
FIG. 9 is a block diagram of a system illustrating an example embodiment of the integration of the single-bit memory cell into a transistor-less chip architecture.

With reference now to FIG. 9, system 900 illustrates an example embodiment of the integration of the single-bit memory cell into a transistor-less chip architecture. As is apparent, system 900 can be substantially similar to the features associated with system 800, with the exception that system 900 need not include transistors 806. Rather, if a transistor-less architecture is employed, bit-line 812 can serve as a common electrode for a column of bit-cells 802 and word-line 810 can serve as common electrode for a row of bit-cells 802, with the bit-cells 802 being sandwiched at the crosses, and therefore individually addressable based upon a unique column-row position.

Figure 10:
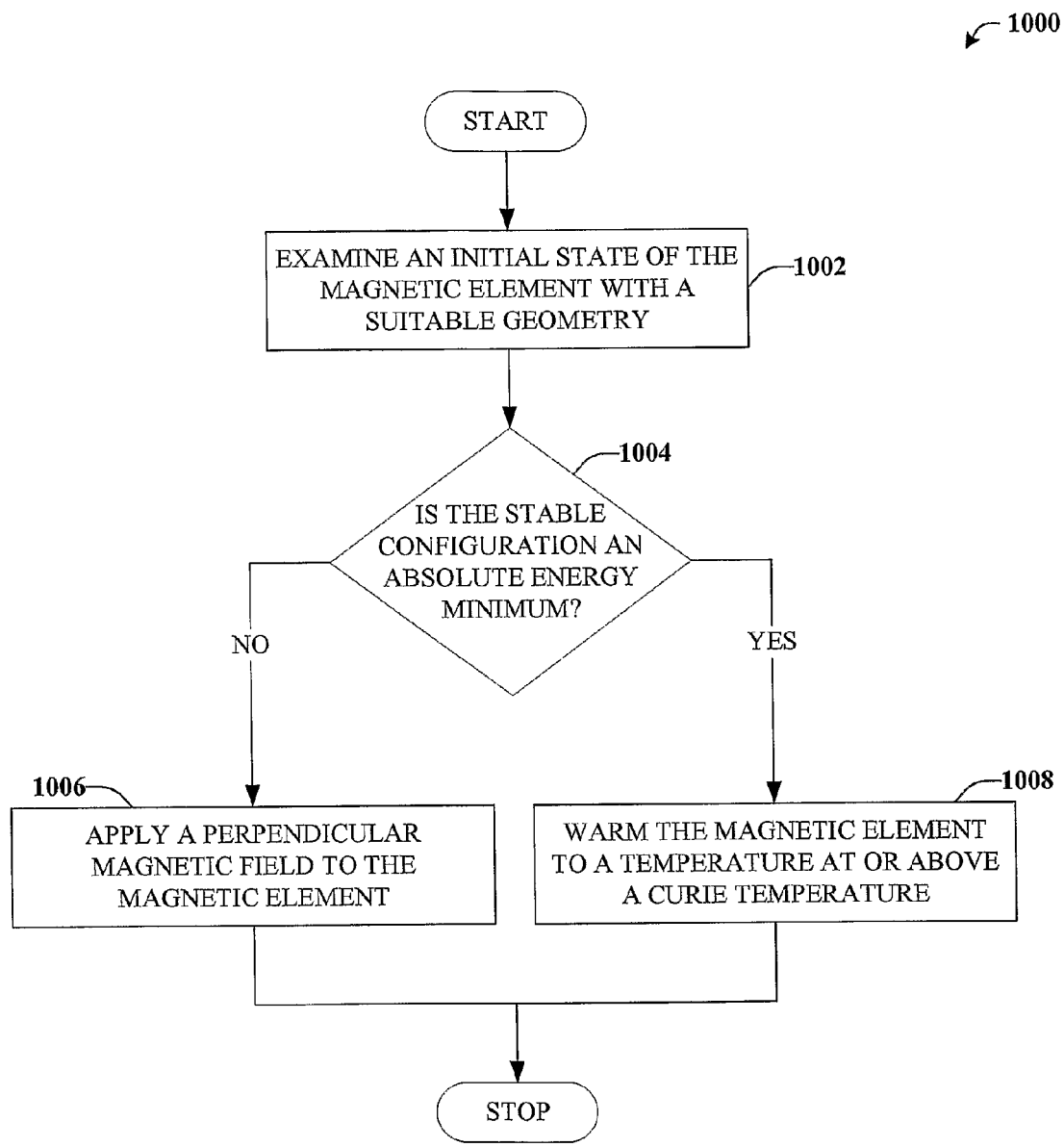
FIG. 10 depicts an exemplary flow chart of procedures that define a method for magnetically stabilizing a magnetic element.
Figure 11:
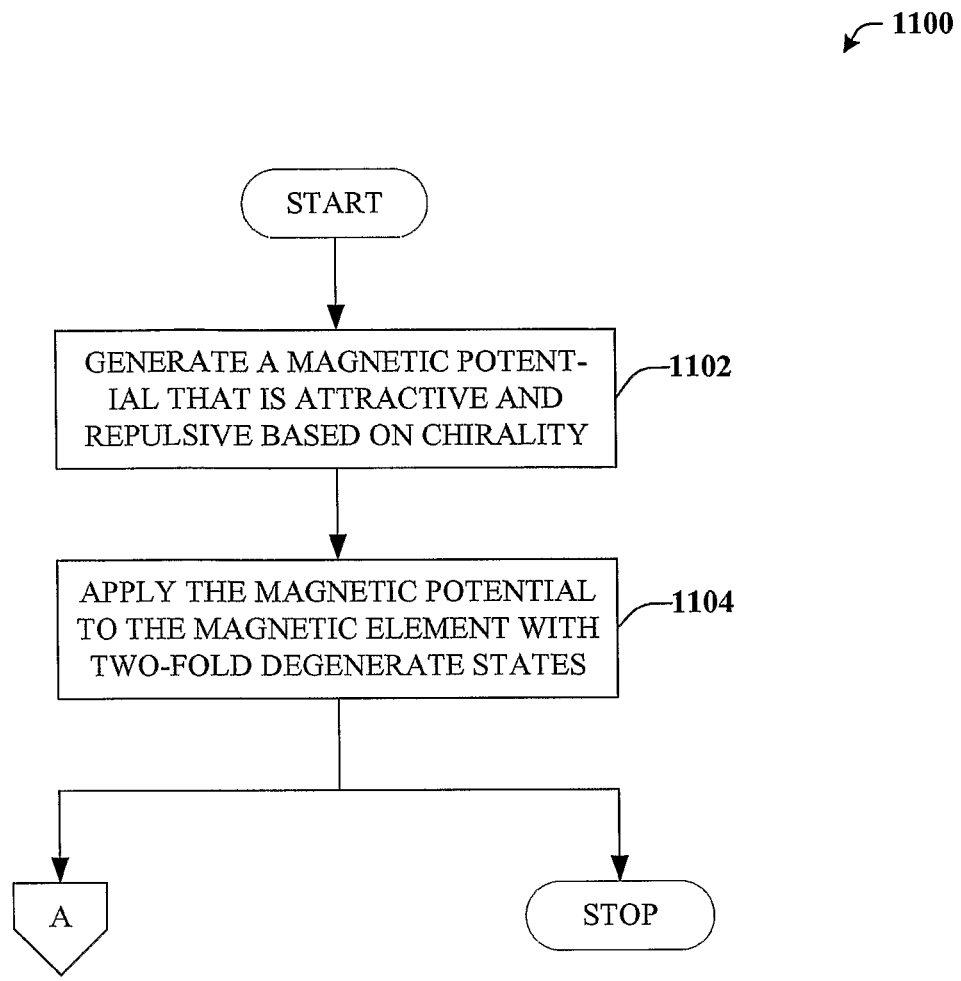
FIG. 11 illustrates an exemplary flow chart of procedures that define a method for asserting a particular magnetically stable state for a suitable magnetic element.
Figure 12:
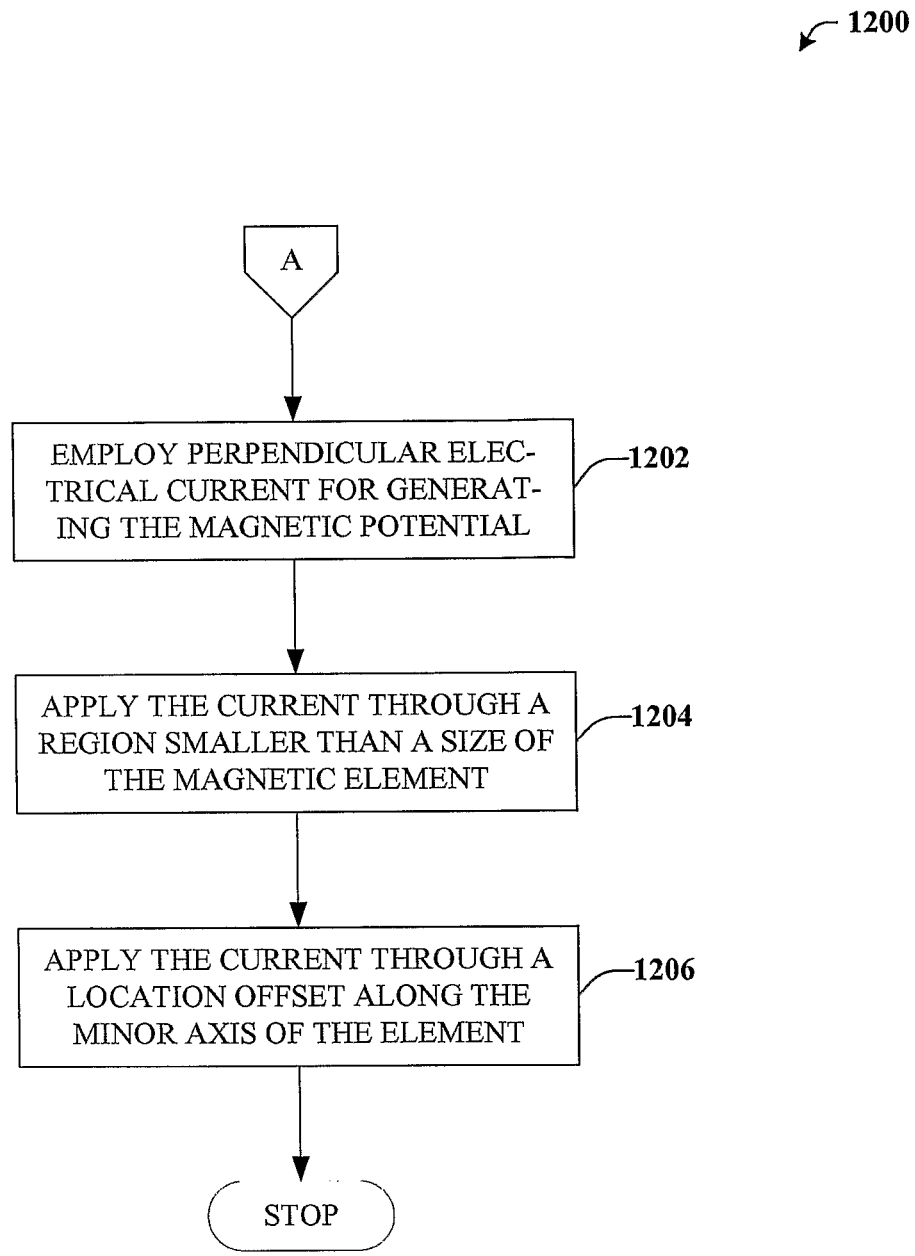
FIG. 12 depicts an exemplary flow chart of procedures defining a method for providing additional features or aspects in connection with asserting a particular magnetically stable state for a suitable magnetic element.

FIGS. 10-12 illustrate various methodologies in accordance with one or more embodiments described herein. While, for purposes of simplicity of explanation, the methodologies are shown and described as a series of acts, it is to be understood and appreciated that the embodiments are not necessarily limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the various embodiments. Additionally, it should be further appreciated that the methodologies disclosed hereinafter and throughout this specification may be capable of being stored on an article of manufacture to facilitate transporting and transferring such methodologies to computers with suitable hardware and/or suitable devices necessary for performing the acts.

With reference now to FIG. 10, exemplary method 1000 for magnetically stabilizing a magnetic element is provided. However, before proceeding with a discussion of method 1000, it should be appreciated that the initial magnetization state of a magnetic element useful as a bit-cell such as that described herein, is not necessarily a flower vortex configuration. For instance, consider the case in which the magnetic element is patterned out of a grown film. In that case, the magnetic state of the magnetic element is likely to be that in which the average magnetization lies along the in-plane easy magnetization axis, which corresponds to the major axis of the magnetic element. Moreover, for certain magnetic element aspect ratios and/or thicknesses, the flower vortex state could be a relative, and not an absolute, two-fold degenerate energy minimum of the system.

In any case the magnetic element can be brought into the flower vortex configuration by applying a field out of the plane of magnitude not smaller than the film saturation magnetization. Alternatively, and only in the case where the flower vortex state is the absolute energy minimum, the initialization can be obtained by warming the system above its Curie temperature. If more than one magnetic element is collectively organized in an array to form a memory device, all magnetic elements will be all simultaneously set in either of the flower vortex states. Such initialization procedures typically need only be done once and can remain in a flower vortex state forever thereafter assuming the array of bit-cells are properly shielded from magnetic field during normal operations as described herein.

In accordance therewith, at reference numeral 1002, an initial state of an elongated, electrically conductive magnetic element with a geometry that allows a two-fold energetically-degenerate magnetic configuration can be examined. Based upon such examination, at reference numeral 1004, a determination can be made. In particular, it can be determined whether a desired stable configuration of the magnetic element represents an absolute energy minimum or a relative energy minimum. If the desired stable configuration of the magnetic element does not represent an absolute energy minimum (and/or instead represents a relative energy minimum), the method 1000 proceeds to reference numeral 1006. On the other hand, if the desired stable configuration of the magnetic element represents an absolute energy minimum, then method 1000 proceeds to reference numeral 1008.

At reference numeral 1006, it has been determined that the desired stable configuration of the magnetic element does not represent an absolute energy minimum and/or does represent a relative energy minimum. Accordingly, a perpendicular magnetic field can be applied to the magnetic element to initialize the magnetic element. On the other hand, at reference numeral 1008, it has been determined that the desired stable configuration of the magnetic element does represent an absolute energy minimum. Therefore, in order to initialize the magnetic element in this case, the magnetic element can be warmed to a temperature greater than or equal to a Curie temperature for the magnetic element. As used herein and known in the art, a Curie temperature varies based upon the composition of the material in question (e.g., a ferromagnetic material) and is related to a reversible temperature above which the material becomes paramagnetic such that the material in a paramagnetic state is only magnetic in the presence of an externally applied magnetic field.

Regardless of the path followed, whether via reference numeral 1006 or 1008, the magnetic element can now be considered initialized such that two flower vortex states that are magnetically stable are possible for the magnetic element. Accordingly, method 1000 can then terminate.

Referring to FIG. 11, exemplary method 1100 for asserting a particular magnetically stable state for a suitable magnetic element is depicted. Generally, at reference numeral 1102, a magnetic potential that is attractive to a magnetic vortex with a first chirality and repulsive to a magnetic vortex with a second chirality can be generated, wherein the first chirality is opposite to that of the second chirality. Thus, at reference numeral 1104, the magnetic potential can be applied to an elongated, electrically conductive magnetic element with two magnetic vortices of opposite chirality and a geometry that allows two-fold, energetically-degenerate magnetic configurations.

In accordance with the above, because the magnetic element can include two magnetic vortices, each with a magnetization associated with different chirality (e.g., clockwise vs. counterclockwise), the magnetic potential that is generated at reference numeral 1102 and applied to the magnetic element at reference numeral 1104 can attract one of the vortices, while repelling the other vortex. Thus, one of the two stable configurations will be asserted based upon the application of the magnetic potential to the magnetic element. For example, if the magnetic element is not in the configuration being asserted, the configuration will switch to that state. However, if the magnetic element is already in the configuration being asserted no changes will be effected once the magnetic potential is removed. Therefore, asserting one or the other of the magnetically stable configurations can function as a write operation for a bit-cell associated with the magnetic element.

Turning now to FIG. 12, exemplary method 1200 for providing additional features or aspects in connection with asserting a particular magnetically stable state for a suitable magnetic element is illustrated. In general, at reference numeral 1202, an electrical current (e.g., a write current)

flowing perpendicular to both major and minor axes of the magnetic element can be employed for generating the magnetic potential detailed in connection with reference numerals 1102 and 1104 of FIG. 11.

Next to be described, at reference numeral 1204, the electrical current can be applied through a region smaller than a size of the magnetic element for generating the magnetic potential. In addition, at reference numeral 1206, the electrical current can be applied through a location of the magnetic element that is offset along a minor axis of the magnetic element. Offsetting the components that convey the electrical current along the minor axis of the magnetic element can result in a slightly higher write current being necessary, but can allow a more effective read operation to be employed.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated or clear from context, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system with at least two magnetically stable states, comprising:
   an elongated, electrically conductive magnetic element with a geometry that supports two-fold, energetically-degenerate magnetic configurations, the elongated, electrically conductive magnetic element comprising:
   a first magnetic vortex;
   a second magnetic vortex; and
   a flower state region situated off-center of a minor axis of the elongated, electrically conductive magnetic element, wherein the flower state region is a region of magnetic intersection along a major axis of the elongated, electrically conductive magnetic element between the first magnetic vortex and the second magnetic vortex, and wherein the first magnetic vortex, the second magnetic vortex, and the flower state region are positioned in a first magnetically stable configuration.

2. The system of claim 1, wherein the geometry of the elongated, electrically conductive magnetic element is configured as an ellipse.

3. The system of claim 1, wherein the first magnetic vortex and the second magnetic vortex are situated on the major axis of the elongated, electrically conductive magnetic element and further situated on opposing sides of the minor axis.

4. The system of claim 1, wherein a first chirality of the first magnetic vortex curls in an opposite direction as a second chirality of the second magnetic vortex, wherein the first chirality relates to a first curling direction of in-plane magnetization of the first magnetic vortex, and wherein the second chirality relates to a second curling direction of in-plane magnetization of the second magnetic vortex.

5. The system of claim 1, wherein the flower state region is characterized by an average in-plane magnetization pointing perpendicular to the major axis of the elongated, electrically conductive magnetic element in the first magnetically stable configuration.

6. The system of claim 1, wherein the elongated, electrically conductive magnetic element is configured to enable displacement of the first magnetic vortex, the second magnetic vortex, and the flower state region along the major axis of the elongated, electrically conductive magnetic element to arrive at a second magnetically stable configuration that is energetically equivalent to the first magnetically stable configuration.

7. The system of claim 1, further comprising a write operation component configured to assert one of the at least two magnetically stable states.

8. The system of claim 7, wherein the write operation component comprises
   a non-magnetic, electrically-conductive contact configured to generate a magnetic potential that is attractive to a chirality of one of, and contemporaneously repulsive to a chirality of another of, the first magnetic vortex and the second magnetic vortex;
   a bottom electrode coupled to the elongated, electrically conductive magnetic element; and
   a top electrode coupled to the non-magnetic, electrically-conductive contact.

9. The system of claim 8, wherein the write operation component is configured to generate the magnetic potential based upon application of an electric current flowing perpendicular to the major axis and the minor axis of the elongated, electrically conductive magnetic element through a region smaller than a size of the elongated, electrically conductive magnetic element.

10. The system of claim 1, further comprising a read operation component comprising
    a magnetoresistive contact configured to sense a magnetic configuration of the elongated, electrically conductive magnetic element;
    a bottom electrode coupled to the elongated, electrically conductive magnetic element; and
    a top electrode coupled to the magnetoresistive contact.

11. The system of claim 10, wherein the read operation component is configured to distinguish between the first magnetically stable configuration and a second magnetically stable configuration based upon a detected voltage between the bottom electrode and the top electrode.

12. The system of claim 1, further comprising a read/write component comprising
    a non-magnetic spacer coupled to the elongated, electrically conductive magnetic element;
    a single- or multi-layer polarizer with fixed magnetization coupled to the non-magnetic spacer;
    a bottom electrode coupled to the elongated, electrically conductive magnetic element; and
    a top electrode coupled to the polarizer.

13. The system of claim 12, wherein the read/write component is configured to generate a magnetic potential based upon application of a write current across the read/write component flowing perpendicular to the major axis and the minor axis of the elongated, electrically conductive magnetic element through a region smaller than a size of the elongated, electrically conductive magnetic element in order to assert one of the at least two magnetically stable states.

14. The system of claim 13, wherein the read/write component is configured to distinguish between the at least two magnetically stable states based upon a detected voltage across the read/write component upon injection of a read current between the top and bottom electrodes that is smaller than the write current.

15. The system of claim 1, further comprising a plurality of additional magnetic elements organized as an array of single-bit memory cells.

16. The system of claim 15, wherein the array of single-bit memory cells further comprises respective lines configured to carry at least one of a read current or a write current.

17. The system of claim 16, wherein the array of single-bit memory cells is configured according to a one-transistor-one cell (1T1C) architecture.

18. The system of claim 16, wherein the array of single-bit memory cells is configured according to a transistor-less architecture.

19. A method for asserting a particular magnetically stable state for an elongated, electrically conductive magnetic element, comprising:
   generating a magnetic potential that is attractive to a first magnetic vortex with a first chirality and repulsive to a second magnetic vortex with a second chirality opposite to that of the first chirality; and
   applying the magnetic potential to the elongated, electrically conductive magnetic element with two magnetic vortices of opposite chirality, a flower state region situated off-center of a minor axis of the elongated, electrically conductive magnetic element, and a geometry that allows two-fold energetically-degenerate magnetic configurations, wherein the flower state region is a region of magnetic intersection along a major axis of the elongated, electrically conductive magnetic element between the first magnetic vortex and the second magnetic vortex.

20. The method of claim 19, further comprising employing an electrical current flowing perpendicular to the major axis and the minor axis of the elongated, electrically conductive magnetic element for generating the magnetic potential.

21. The method of claim 20, further comprising applying the electrical current through a region smaller than a size of the elongated, electrically conductive magnetic element for generating the magnetic potential.

22. The method of claim 20, further comprising applying the electrical current through a location of the elongated, electrically conductive magnetic element that is offset along a minor axis.

23. A system that provides non-volatile memory based upon a magnetic configuration, comprising:
   an array of elongated, electrically conductive magnetic cells of which at least one magnetic cell is arranged according to a geometry that allows dual energetically-degenerate magnetic configurations, wherein either one of the dual energetically-degenerate magnetic configurations is magnetically stable with a flower state region situated off-center relative to a minor axis of the at least one magnetic cell, and wherein the flower state region is a region of magnetic intersection along a major axis of the at least one magnetic cell between a first magnetic vortex and a second magnetic vortex;
   a reading head for sensing a current state of one or more magnetic cells included in the array; and
   a writing head for asserting a magnetically stable state consistent with either one of the dual energetically-degenerate magnetic configurations for the one or more magnetic cells included in the array.

24. The system of claim 23, wherein a single magnetoresistive contact is used for the reading head and the writing head associated with a single magnetic cell included in the array.

* * * * *